INVENTOR
G. J. OVERTVELD
Curphey & Erickson
AGENT

INVENTOR
G. J. OVERTVELD
Cushey & Erickson
AGENT

INVENTOR
G. J. OVERTVELD
Cuyphey & Erickson
AGENT

Dec. 17, 1968 G. J. OVERTVELD 3,417,340

VARIABLE GAIN CIRCUIT

Filed March 4, 1965 4 Sheets-Sheet 4

INVENTOR
G. J. OVERTVELD
Cumpston & Erickson
AGENT

United States Patent Office 3,417,340
Patented Dec. 17, 1968

3,417,340
VARIABLE GAIN CIRCUIT
Gilles Jozias Overtveld, Ottawa, Ontario, Canada, assignor to Northern Electric Company Limited, Montreal, Quebec, Canada
Filed Mar. 4, 1965, Ser. No. 437,137
7 Claims. (Cl. 330—24)

ABSTRACT OF THE DISCLOSURE

The invention relates to a transistorized variable gain circuit comprising a transistor and a junction diode connected in series with the emitter-collector electrodes of the transistor. A source of input signal is applied to the base electrode of the transistor and a source of control voltage for controlling the A.C. impedance of the diode is connected to the emitter electrode. The output of the variable gain circuit is taken from across the diode and may be varied in accordance with the control current applied to the diode. Because the output impedance of the transistor is high attenuations of 20 db per decade of control current have been obtained. Also a fairly high control current through the diode can be obtained readily with small values of control voltage.

This invention relates to controlled attenuators and more particularly to variable gain circuits capable of controlling the level of an audio program automatically.

Speech or music levels are subject to large variations that do often occur unexpectedly. It is technically impractical to design the audio system between the loudspeaker of the listener and the studio microphone so that it would accommodate the total dynamic range of all possible audio levels. It is therefore necessary to manipulate attenuators during the course of an audio program to prevent over modulation and distortion on high or excessive noise on low audio levels.

This need for control of program level has resulted in the development of a variety of attenuation devices which are inserted in the link between the studio microphone and the listener's loudspeaker. Some of the known devices are the light-sensitive resistors, the Hall effect devices and the Variable Mu tubes.

Most of these devices, however, do not satisfy all the main criteria for suitable variable gain circuits which are:

(1) Maximum variable gain for a given distortion (e.g. 0–40 db range of input signal).
(2) Low distortion.
(3) Uniformity of control between devices.
(4) The speed at which gain can be changed (attack time).
(5) Effect on frequency response.

The light-sensitive resistors for example have low distortion at high signal level because light not current is the actuating source. However the variation between two individual light-sensitive resistors does not seem to be much better than 2 db. Non-uniformity of control makes them unsuitable for stereo channel separation where 0.5 db is required or as calibrated remote attenuator. Furthermore the incandescent light bulb is slow and the neon light source too irregular to make the light sensitive resistor suitable for automatic volume control or as a peak limiter in audio. Speeds of attack smaller than 50 μsec. are also desirable in these applications while the light sensitive resistor at their best have attack times measured in milliseconds.

The Hall effect device has proved to be unsuitable because of non-uniformity of control between devices and because of sensitivity to temperature variations.

Variable gain tubes generate unwanted transients because once balanced they will, due to aging or temperature variation, soon become unbalanced.

One way of overcoming the variation in control characteristics is by using the variable gain circuit in a feedback control loop. The system output level then determines the loss. This loss will be uniform regardless of the difference in transfer function between devices. This is why variable mu tubes are used extensively in feedback control loops for peak limiter applications. But for many other applications a feedback control loop cannot be used e.g. whenever the control is not derived from the level of the controlled signal itself. For instance, the left channel of stereo may be desired to be controlled by "Left+Right." It is therefore important that control of the variable gain device can be obtained over an extended range (0–40 db loss) which is uniform with respect to control current or voltage from device to device while maintaining all other characteristics such as distortion, speed of response, and effect on frequency response.

Furthermore it has been found that in practice the desired constant output cannot be obtained with a feedback system because the magnitude of feedback is limited by stability. Where a large control range is required, the high frequency response and attack time are sacrified to obtain stability. Where a short attack time is necessary the high frequency response is increased and the control range reduced. In other words constant output and attack time are interdependent. Feedback design becomes further complicated by generation of unwanted control transients which decay according to loop stability and cause over correction.

From the above it is seen that the feedback control is not satisfactory to overcome the deficiencies of the prior art devices. The forward feed control offers more advantages because with the forward feed control it is possible to combine fast attack time and a flat output over a wide operating range and because over correction is not possible. Furthermore the forward feed control makes it possible to control the output by means of an independent control signal.

Another basic attenuator circuit comprising a ratio circuit including a high impedance element in series with a junction diode is also found in the art. The input signal is applied to the full ratio circuit while the output signal is taken across the junction diode. A source of control voltage supplies a control current to the junction diode which varies the small signal A.C. current resistance of the diode inversely in accordance with the control current thereby varying the output of the attenuator inversely in accordance with the control voltage. This circuit may be used with advantage in a forward feed control because the control voltage may be derived from the input signal or from an independent source.

Furthermore experiments have revealed that the the silicon junction diodes have an excellent uniformity in dynamic impedance. It has been found that in a total of about 100 diodes over a range of 40 db less than 0.2 db variation could be expected.

In practice however, it was found that the above circuit does not have sufficient attenuation. To obtain the desired attenuation an attenuator circuit was developed in accordance with the invention. The circuit comprises a transistor having its emitter and collector electrodes connected in series with a junction diode. The input signal is applied to the base or emitter electrodes and the output is taken across the junction diode. A source of control voltage which may be derived from the input signal or from an independent source supplies a control current to the junction diode through the emitter collector electrodes of the transistor and thereby varies the small signal A.C. current resistance of its diode in very much the same way as the above mentioned ratio circuit.

The invention wil now be described with reference to the drawings in which.

Figure 1:
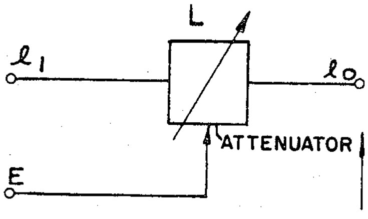
FIG. 1 is a block diagram of an attenuator whose output is controlled by a control voltage.
Figure 2:
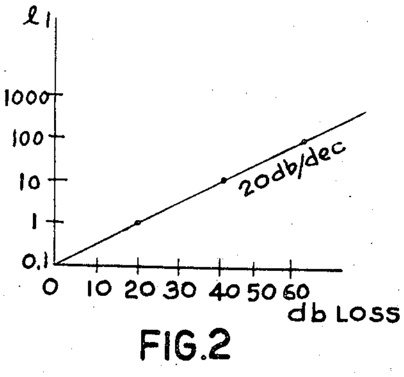
FIG. 2 illustrates the transfer characteristic of an attenuator having a loss of 20 db/DC of increase in input signal.

In FIGURE 1, there is shown a block diagram of a variable gain circuit of the open loop type comprising an attenuator L whose transfer function is controlled by a D.C. control voltage E which may be derived from the input signal or derived from an independent source. In this circuit it is required that $e_0$ remains constant with increasing or decreasing $e_1$. If for example, $e_1$ increases ten times, L needs to increase its loss by 20 db for constant output. This is exemplified in FIGURE 2 which illustrates the desired characteristic of an attenuator having a 20 db loss per decade of increase of input signal. In this FIGURE 20 log $e_1/e_0$, is plotted versus the input voltage $e_1$ on a semilog scale.

Figures 3, 4, 5:
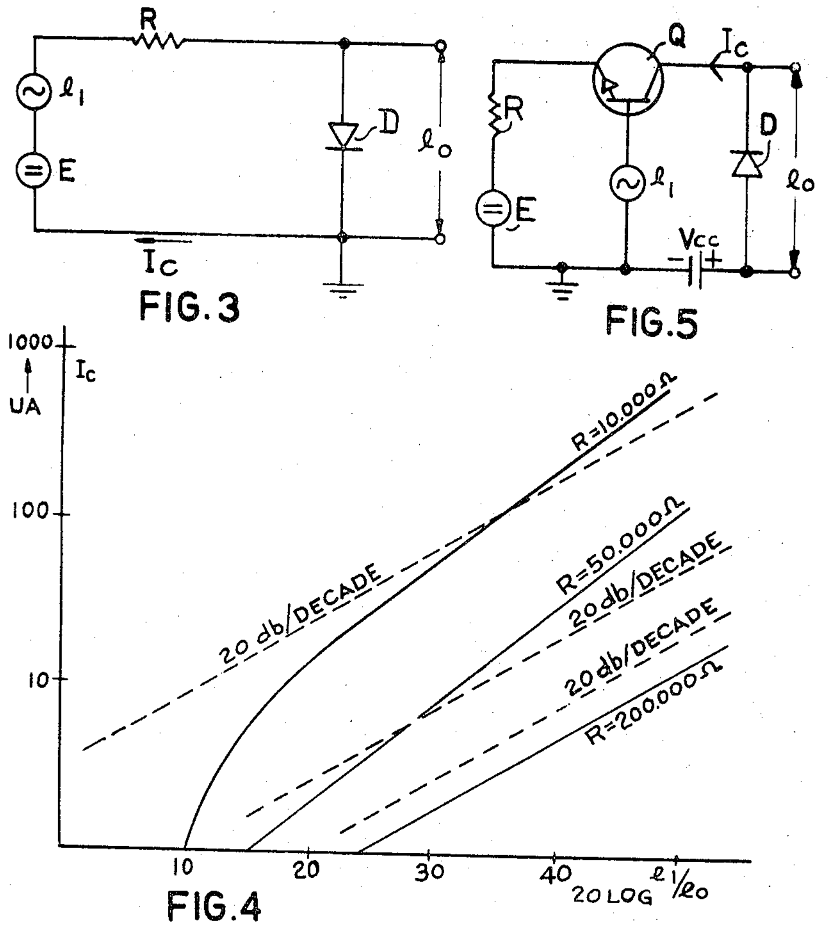
FIG. 3 illustrates the circuit diagram of a basic attenuator circuit.
FIG. 4 illustrates the transfer characteristic of the attenuator shown in FIGURE 3.
FIG. 5 illustrates an attenuator circuit in accordance with the invention.

In FIG. 3, there is shown a basic attenuator circuit comprising an A.C. source of signal $e_1$, a D.C. source of control voltage E, a resistor R and a junction diode D across which is taken the output of the attenuator. The junction diode has a good characteristic for application in a gain control circuit because the small signal resistance of a junction diode biased in the forward direction may be expressed analytically at:

$$r_d=\frac{K_1}{I_c}$$

or the small signal resistance is proportional to the inverse of $I_c$ where $K_1$ is a constant. Now if in FIGURE 3 the small signal current is proportional to $e_1$ then the small signal output is:

$$e_0=ir_d=\frac{K_1 i}{I_c}=\frac{K_1K_2e_1}{E}$$

which means that by varying the D.C. control voltage E, the gain of the attenuator may be controlled accordingly.

In FIGURE 4, the loss of such an attenuator 20 log $e_1/e_0$ is plotted versus the control current $I_c$ on a semilog scale with R as a parameter. If R is large (200K) the loss approaches 20 db per decade of $I_c$ as seen from the drawing. It would therefore be possible to use the circuit of FIGURE 3 as a 20 db/dec. attenuator. However if R equals 200K ohms, E will have to be fairly high in order to provide an adequate current through the diode which means that in practice the above circuit cannot be used for attenuations of 20 db/dec. and higher.

In order to obtain higher attenuations a circuit such as shown in FIGURE 5 was developed in accordance with the invention. This circuit comprises a transistor Q wherein the signal voltage $e_1$ is applied to its base and the control voltage applied to the emitter through a resistor R. A junction diode D is connected in the collector circuit of transistor Q and the output $e_0$ is taken across the diode D. The collector biasing potential is provided by source Vcc.

Because the output impedance of the transistor Q is high adequate attenuation can be readily obtained. Furthermore a fairly high control current $I_c$ through the diode can be obtained readily with small values of E. With this circuit attenuation up to 60 db/dec. can be obtained. With 100 μa. initial current and R=500 ohms the insertion loss is 0 db.

Figures 6, 7:
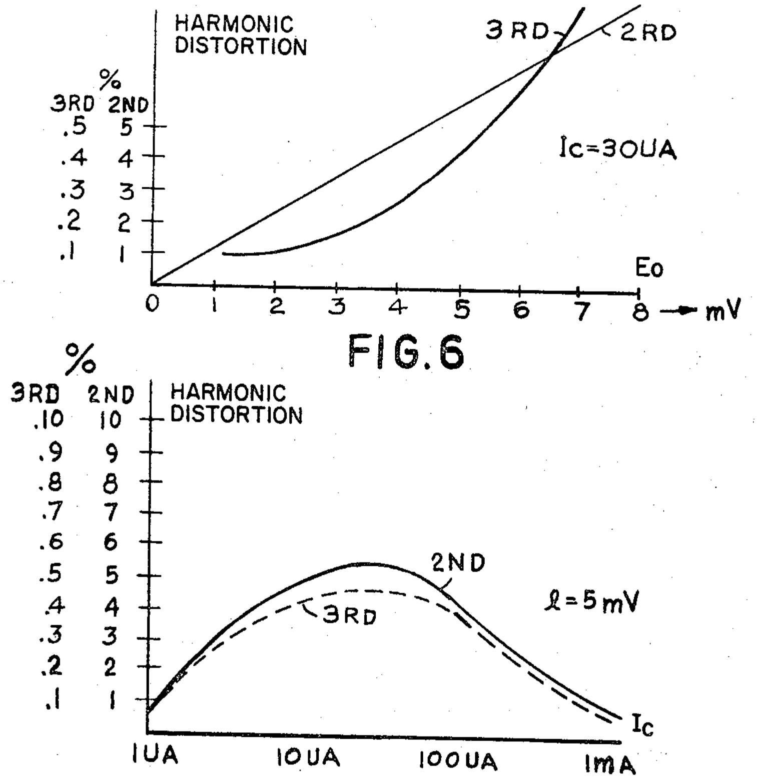
FIG. 6 illustrates the harmonic distortion versus signal across the diode shown in FIG. 5 for a constant current.
FIG. 7 illustrates the harmonic distortion versus control current across the diode shown in FIGURE 5 for a constant signal voltage.

Another factor that governs the feasibility of variable gain devices is the amount of harmonic distortion. The harmonic distortion versus signal across the junction diode is shown in FIGURE 6 for constant control current of 30 μa. Distortion versus control current with constant signal is shown in FIGURE 7. These measurements suggest that real improvement can be obtained by balancing as per FIGURE 8.

Figure 8:
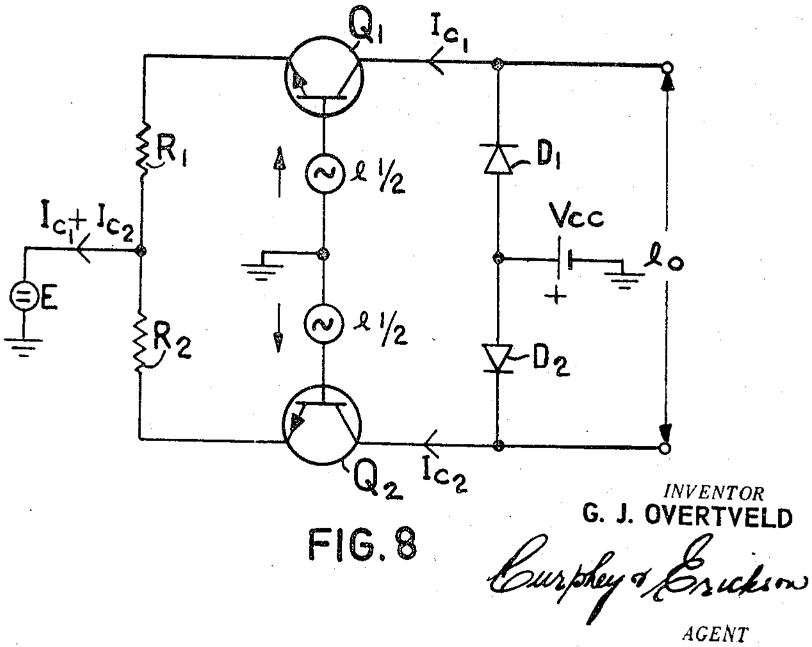
FIG. 8 illustrates a second embodiment of the invention.

In FIGURE 8, the A.C. signal is applied out of phase to the two bases of transistors $Q_1$ and $Q_2$. A source of control voltage E is applied to the junction point between resistors $R_1$ and $R_2$ which are connected to the emitters of transistors $Q_1$ and $Q_2$ respectively. The biasing potential of the collector electrodes is provided by a source of D.C. potential Vcc. The oppositely poled diodes $D_1$ and $D_2$ are connected in series with the collector electrodes of transistors $Q_1$ and $Q_2$ and the ouptut signal is taken across both diodes. The second harmonic cancels out in this circuit leaving the third harmonic which is approximately 1/10 of the second harmonic. Furthermore the distortion decreases with increasing $I_c$ as shown in FIGURE 7. From the curve, it is seen that $I_c$ should be kept larger than 50 μa.

Figure 9:
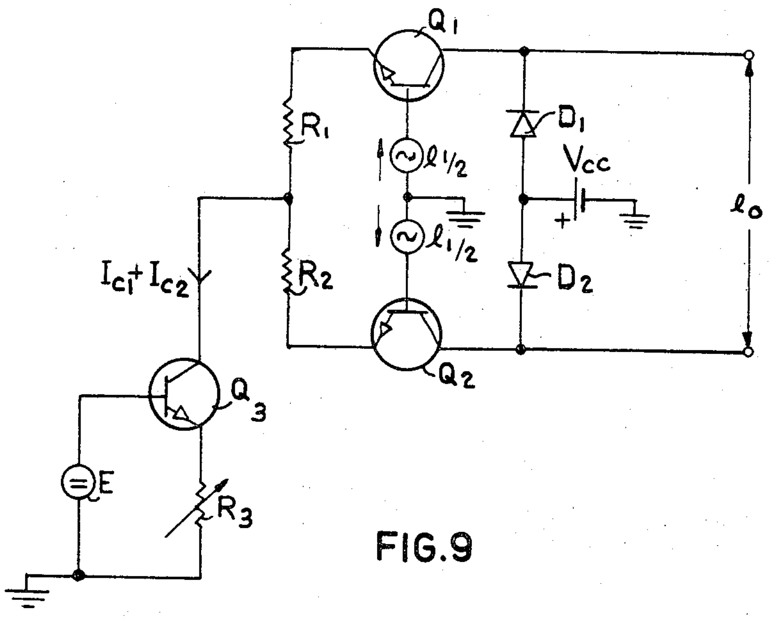
FIG. 9 illustrates a third embodiment of the invention.

A further extension of the circuit of FIGURE 8 is shown in FIGURE 9. The circuit of FIGURE 9 is identical to the circuit of FIGURE 8 except for the addition of transistor $Q_3$. The addition of transistor $Q_3$, transforms the circuit in a so-called long-tail pair. In this circuit the total current is fixed by $E/R_3$. The division of current between $Q_1$ and $Q_2$ is not only dependent on $R_1$ ad $R_2$, but also on the $V_{be}$ of each transistor which as we know vary with the temperature.

A change in temperature of $Q_1$ and $Q_2$ by current or environmental effects of temperature effects both transistors, hence the current ratio between the two transistors $Q_1$ and $Q_2$ is equal to $$\frac{I_{c_1}}{I_{c_2}}=\frac{R_1}{R_2}$$

and is not disturbed by any change in temperature.

Figure 10:
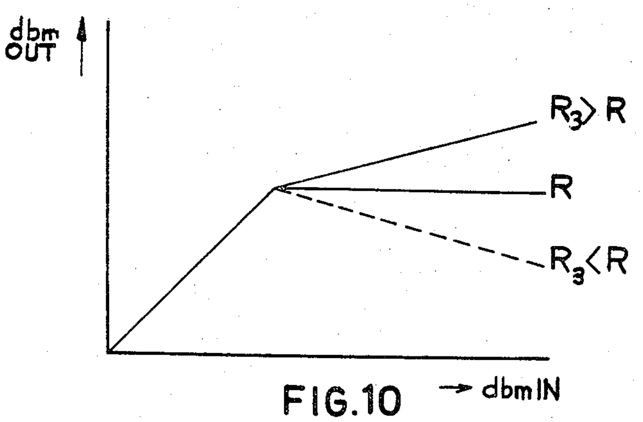
FIG. 10 illustrates the complete transfer function of the attenuator shown in FIGURE 9 in $dbm_{in}$ versus $dbm_{out}$.

FIGURE 10 illustrates the transfer characteristic of the attenuator shown in FIGURE 9 in $dbm_{in}$ versus $dbm_{out}$. If E is proportional to $e_1$, then it becomes possible to adjust the transfer curve for flat, decreasing or increasing output with input by varying $R_3$. This is possible because the control current may be changed by varying $R_3$ without affecting the gain which is determined by $$\frac{Rd}{R_1+R_2}$$

Figure 11:
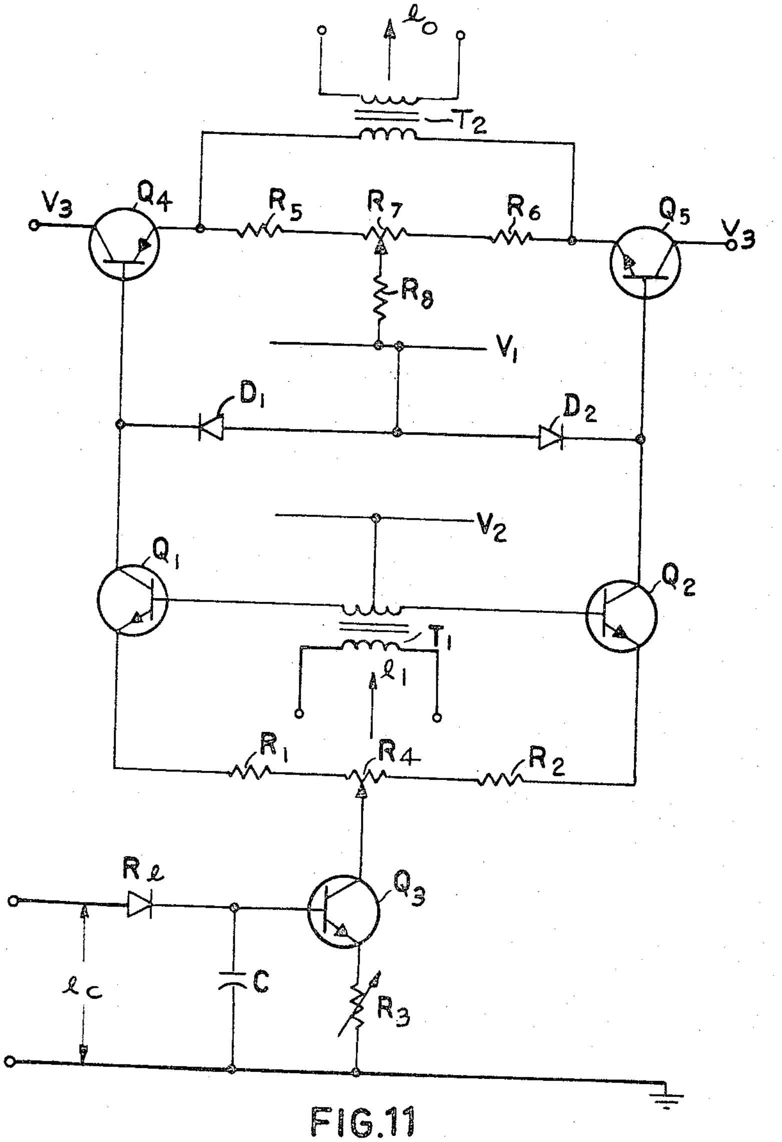
FIG. 11 illustrates a fourth embodiment of the invention.

A further embodiment of the invention is the circuit of FIGURE 11. The A.C. signal $e_1$ is applied to the bases of transistors $Q_1$ and $Q_2$ through transformer $T_1$. The collector circuit of transistors $Q_1$ and $Q_2$ includes resistors $R_1$, $R_2$ and $R_4$ which determines the input impedance of the attenuator.

A control voltage $e_c$ which may be proportional to $e_1$ or an independent control signal is applied to the base of a transistor $Q_3$ through a rectifier Re and capacitor C. The amplitude of the rectified voltage applied to transistor $Q_3$ and the value of variable resistor $R_3$ in the emitter circuit of transistor $Q_3$ determines the amount of control current which will flow in transistors $Q_1$ and $Q_2$ and diodes $D_1$ and $D_2$. Resistor $R_4$ provides for proper balance of the control currents in transistors $Q_1$ and $Q_2$.

Oppositely poled diodes $D_1$ and $D_2$ are connected across the collector electrodes of transistors $Q_1$ and $Q_2$. The signal output across the collectors is roughly the ratio of the small signal resistance of $D_1$ and $D_2$ and the sum of $R_1$, $R_2$ and $R_4$. This signal is directly coupled to transistors $Q_4$ and $Q_5$ which serve as balanced emitter followers and isolate the variable output impedance of the diodes from the output transformer $T_2$ which is connected between the emitter electrodes of transistors $Q_4$ and $Q_5$.

Potential sources $V_1$, $V_2$ and $V_3$ and resistors $R_5$, $R_6$, $R_7$ and $R_8$ provide for proper biasing of transistors $Q_1$, $Q_2$, $Q_4$ and $Q_5$ as it is well known in the art. Variable resistor $R_7$ also provides for proper balancing of transistors $Q_4$ and $Q_5$.

It is very important to note, in connection with the disclosed attenuator circuit that the control current nowhere passes through reactive elements and that consequently this circuit can change gain in a few $\mu$secs.

While in the disclosed attenuator circuit, the signal source is applied to the base electrode of the transistor, it is understood that the signal source may be connected to the emitter electrode in series with the control voltage source. In such a case however a control current equal to $I_c$ as compared to $I_c/B$ in the disclosed circuit passes through the signal source *e*. In the case where the signal source is a transformer, the energy stored in the transformer will be higher and effect the response characteristic of the attenuator.

What is claimed is:

1. An attenuator circuit for producing an amplification gain varying proportionally to the magnitude of a control voltage comprising a transistor having base, emitter and collector electrodes, an input circuit connected to the base and emitter electrodes of the transistor, and including an input signal source and a control voltage source, connected to said input circuit and a junction diode across which is taken the output signal connected in series with the emitter and collector electrodes of the transistor through said input circuit, the cathode of said diode being connected to said collector electrode for forward conduction of said diode; the control voltage supplying a control current to the junction diode through the emitter and collector electrodes of the transistor for controlling the small signal A.C. resistance of the diode inversely in accordance with said control current thereby varying the output of said attenuator inversely in accordance with said control voltage.

2. An attenuator circuit as defined in claim 1 wherein the input signal source is connected to the base electrode and the control voltage source is connected to the emitter electrode.

3. An attenuator circuit as defined in claim 1 wherein said control voltage source is controlled by said input signal source.

4. An attenuator circuit as defined in claim 1 wherein said control voltage source is controlled from an independent source of control.

5. A balanced attenuator circuit for producing an amplification gain varying proportionally to the magnitude of a control voltage comprising two transistors connected back to back each transistor having base, collector and emitter electrodes, an input signal being applied in phase opposition to the base electrodes of the transistors, a source of control D.C. voltage connected to the emitter electrodes and a pair of oppositely poled junction diodes across which is taken the output signal, the cathode of said junction diodes being connected to the collector electrodes, the source of control voltage supplying a control direct current to said diodes through the emitter and collector electrodes of the transistors for controlling the small signal A.C. current resistance of the diodes inversely in accordance with said control current thereby varying the output of said attenuator inversely in accordance with said control voltage.

6. A balanced attenuator circuit for producing an amplification gain varying proportionally to the magnitude of a control voltage comprising two transistors connected back to back each transistor having base, collector and emitter electrodes, an input signal being applied in phase opposition to the base electrodes of the transistors, a source of control D.C. voltage connected to the emitter electrodes, a pair of oppositely poled junction diodes across which is taken the output signal connected across the collector electrodes, the source of control voltage supplying a control direct current to said diodes for controlling the small signal A.C. current resistance of the diodes inversely in accordance with said control current thereby varying the output of said attenuator inversely in accordance with said control voltage, and a third transistor, said source of control voltage being applied to the emitter electrodes through said third transistor whereby the amount of control current is controlled by said third transistor.

7. An attenuator circuit as defined in claim 6 further including a balanced emitter follower stage connected to the output diodes for isolating the variable output impedance of the diodes from the output of the attenuator.

References Cited

UNITED STATES PATENTS

| | | | |
|---|---|---|---|
| 3,015,781 | 1/1962 | Eklov | 330—24 |
| 3,127,577 | 3/1964 | Lapointe | 330—29 |

ROY LAKE, *Primary Examiner.*

LAWRENCE J. DAHL, *Assistant Examiner.*

U.S. Cl. X.R.

330—29